(12) United States Patent
Yamada

(10) Patent No.: US 8,395,897 B2
(45) Date of Patent: Mar. 12, 2013

(54) ELECTRICAL POWER COMPONENT ATTACHED TO CHASSIS OF AN ELECTRICAL POWER APPARATUS

(75) Inventor: Yosuke Yamada, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 0 days.

(21) Appl. No.: 12/621,587

(22) Filed: Nov. 19, 2009

(65) Prior Publication Data

US 2010/0321896 A1 Dec. 23, 2010

(30) Foreign Application Priority Data

Jun. 17, 2009 (JP) ................. 2009-144434

(51) Int. Cl.
*H05K 7/20* (2006.01)
*F28F 7/00* (2006.01)
*H01L 23/34* (2006.01)

(52) U.S. Cl. ....... 361/699; 361/702; 361/718; 165/80.4; 165/80.5; 165/104.33; 257/714; 363/141

(58) Field of Classification Search .................. 361/689, 361/699, 702, 704, 707, 718; 165/104.33, 165/185; 211/26, 26.2; 312/223.1, 236, 312/265.1–265.3; 363/141
See application file for complete search history.

(56) References Cited

U.S. PATENT DOCUMENTS

| | | | |
|---|---|---|---|
| 5,045,924 A * | 9/1991 | Ikegame | 257/721 |
| 5,631,821 A * | 5/1997 | Muso | 363/141 |
| 6,262,906 B1 * | 7/2001 | Salzmann et al. | 363/141 |
| 7,450,382 B1 * | 11/2008 | Fischer et al. | 361/695 |

FOREIGN PATENT DOCUMENTS

| | | | |
|---|---|---|---|
| CN | 101145727 A * | 3/2008 | |
| JP | 04253579 A * | 9/1992 | |
| JP | 06104582 A * | 4/1994 | |
| JP | 2004-96832 | 3/2004 | |
| WO | WO 2010090326 A1 * | 8/2010 | |

* cited by examiner

*Primary Examiner* — Zachary M Pape
(74) *Attorney, Agent, or Firm* — Finnegan, Henderson, Farabow, Garrett & Dunner, L.L.P.

(57) ABSTRACT

There is provided an electrical power component attached to a chassis of an electrical power apparatus, including a semiconductor element constituting an electronic circuit, and cooling unit having a planar shape which cools the semiconductor element and serves as a reinforcing material for increasing strength of the chassis.

4 Claims, 7 Drawing Sheets

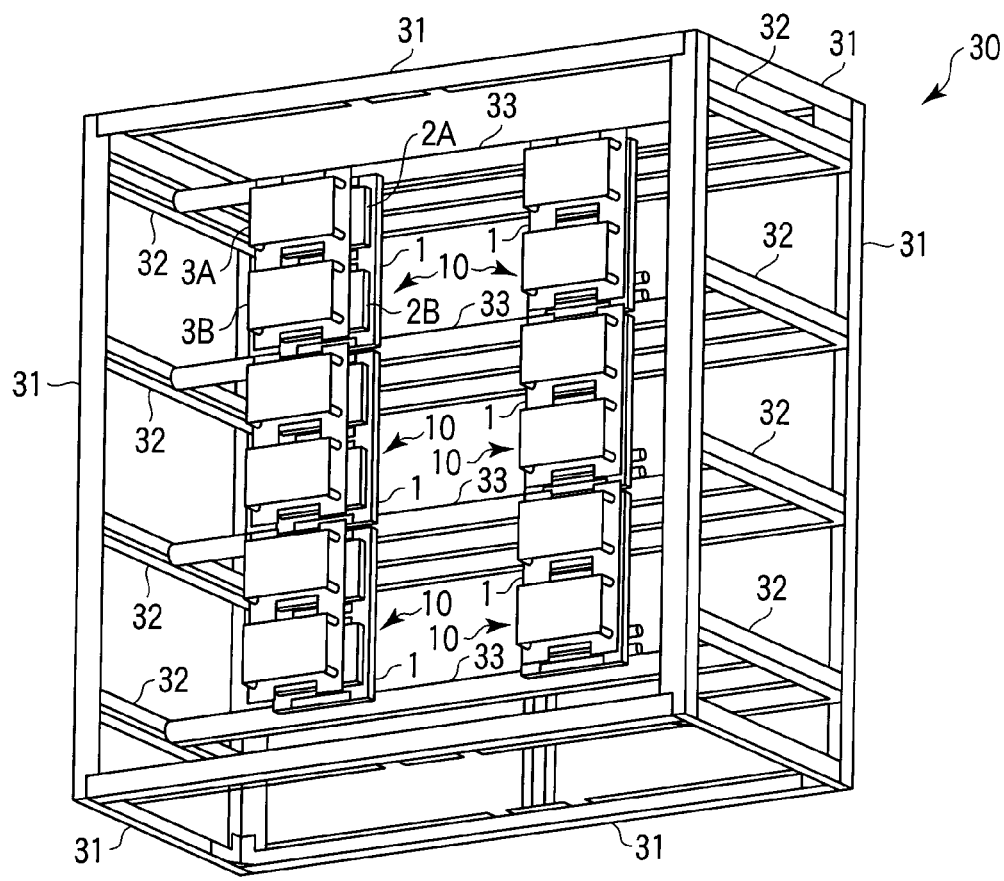
F I G. 7

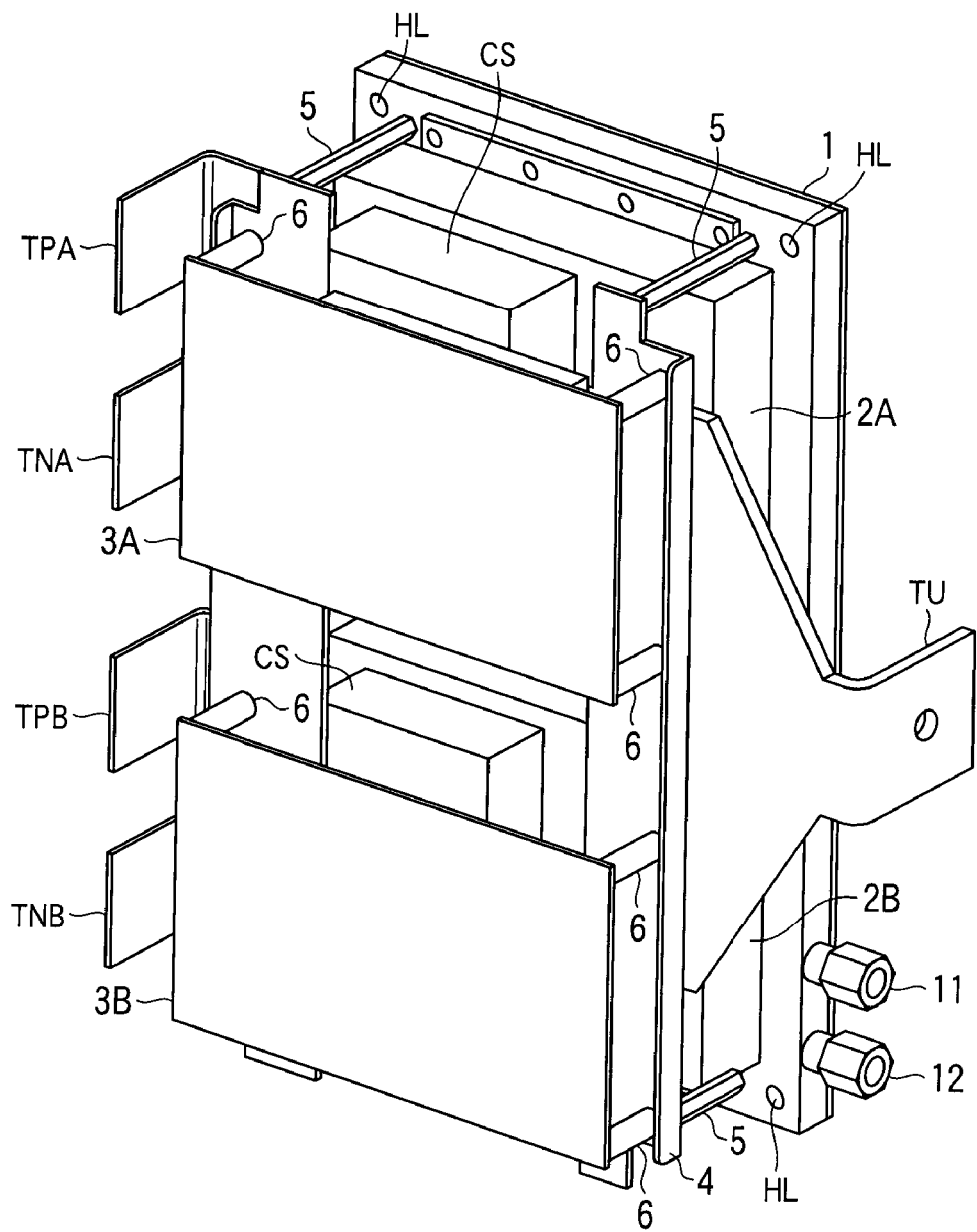
F I G. 11

ELECTRICAL POWER COMPONENT ATTACHED TO CHASSIS OF AN ELECTRICAL POWER APPARATUS

CROSS-REFERENCE TO RELATED APPLICATIONS

This application is based upon and claims the benefit of priority from prior Japanese Patent Application No. 2009-144434, filed Jun. 17, 2009, the entire contents of which are incorporated herein by reference.

BACKGROUND OF THE INVENTION

1. Field of the Invention

The present invention relates to an electrical power component attached to a chassis of an electrical power apparatus.

2. Description of the Related Art

Incorporating a unit including an electronic circuit configured with a semiconductor element into a chassis of an electrical power apparatus (e.g., power converter) is generally performed. Also, the unit is provided with a cooling mechanism for cooling the semiconductor element that generates heat (see JP-A 2004-96832 (KOKAI)).

However, a unit configured in the above manner tends to be heavy. In order to attach the unit to the chassis, reinforcing material for supporting weight of the unit is required. Therefore, an electrical power apparatus manufactured by incorporating the above-mentioned unit into a chassis requires various parts, such as reinforcing material for supporting the weight of the unit and plates for attaching a cooling fin. The number of components constituting the entire electrical power apparatus thus increases, and so do assembly man-hours.

BRIEF SUMMARY OF THE INVENTION

It is an object of the present invention to provide an electrical power component, which is attached to a chassis of an electrical power apparatus, to reduce the number of components of the entire electrical power apparatus.

According to an aspect of the present invention, there is provided an electrical power component attached to a chassis of an electrical power apparatus, comprising: a semiconductor element constituting an electronic circuit; and cooling unit having a planar shape which cools the semiconductor element and serves as a reinforcing material for increasing strength of the chassis.

BRIEF DESCRIPTION OF THE SEVERAL VIEWS OF THE DRAWING

FIG. 7 is a perspective view showing a configuration of the electrical power apparatus on which the power converter according to the first embodiment is mounted.

FIG. 11 is a perspective view showing a configuration of a power converter according to a modification of the first embodiment.

DETAILED DESCRIPTION OF THE INVENTION

Now, embodiments of the present invention will be explained with reference to accompanying drawings.

First Embodiment

Figure 1:
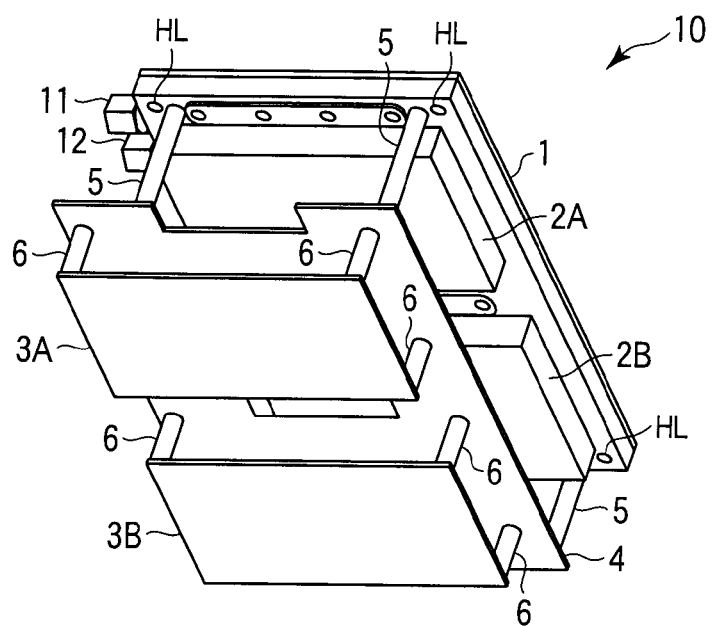
FIG. 1 is a perspective view showing a configuration of a power converter according to a first embodiment of the present invention.
Figure 2:
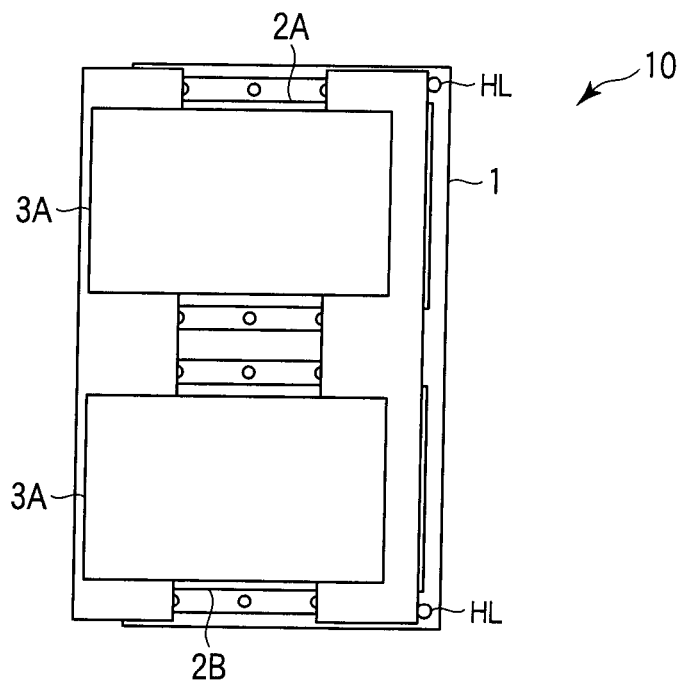
FIG. 2 is a front view showing the configuration of the power converter according to the first embodiment.
Figure 3:
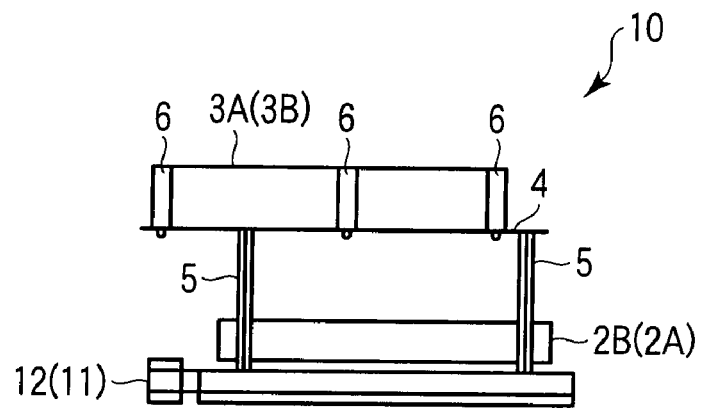
FIG. 3 is a top view showing the configuration of the power converter according to the first embodiment.
Figure 4:
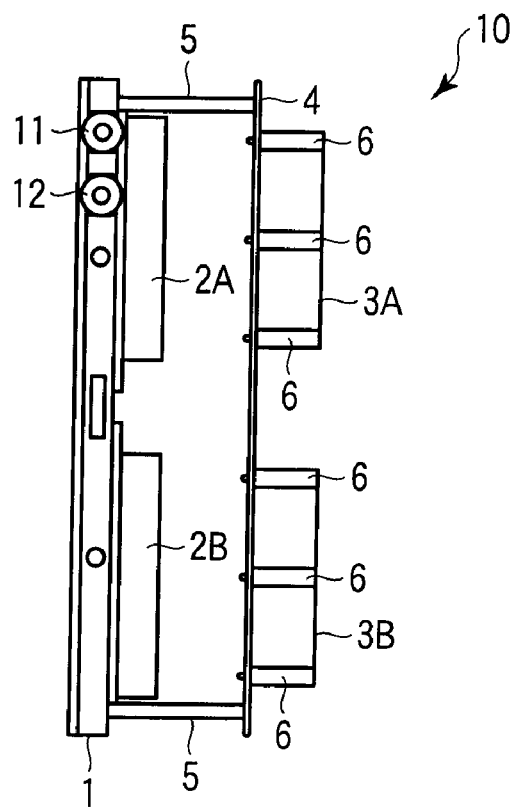
FIG. 4 is a side view showing the configuration of the power converter according to the first embodiment.
Figure 5:
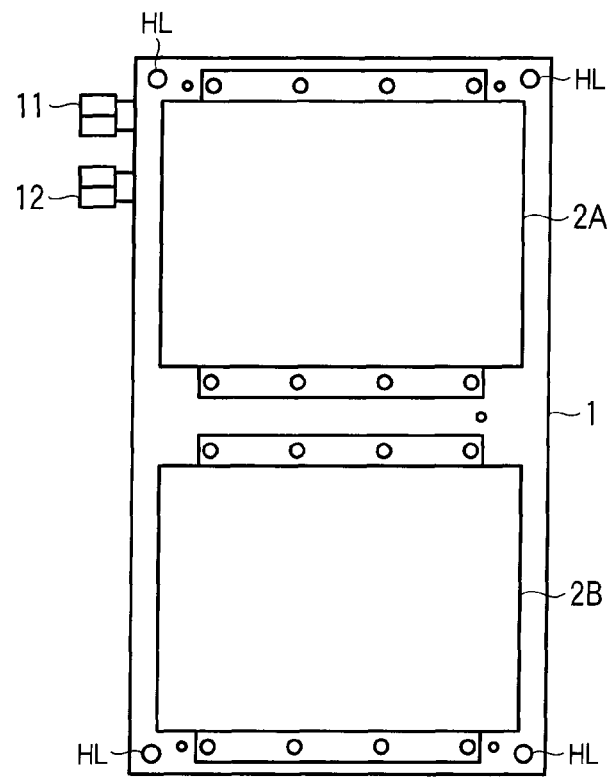
FIG. 5 is a front view showing a configuration of a cooling fin and semiconductor elements of the power converter according to the first embodiment.

FIG. 1 is a perspective view showing a configuration of a power converter 10 according to the first embodiment of the present invention. FIG. 2 is a front view showing the configuration of the power converter 10 according to the present embodiment. FIG. 3 is a top view showing the configuration of the power converter 10 according to the present embodiment. FIG. 4 is a side view showing the configuration of the power converter 10 according to the present embodiment. FIG. 5 is a front view showing the configuration of a cooling fin 1 and semiconductor elements 2A, 2B of the power converter 10 according to the present embodiment. The same parts of FIGS. 1 to 5 are denoted by the same reference numerals. Also, the same parts of the subsequent drawings and detail explanations are omitted, and different parts are mainly explained. As for a subsequent embodiment, overlapping explanations are similarly omitted.

The power converter 10 is equipped with a cooling fin 1, two semiconductor elements 2A and 2B, two gate substrates 3A and 3B, a flat plate 4, a plurality of first support rods 5, and a plurality of second rods 6. Although the power converter 10 is provided with various conductors (direct current conductor or alternating current conductor) serving as a terminal for connecting with an external electronic circuit, those conductors are not shown for the sake of convenience of explanation.

The power converter 10 is an electrical power component incorporated in an electrical power apparatus such as a power converter or a power supply apparatus. The power converter 10 has a function of converting DC power into AC power (and vice versa).

The cooling fin 1 is planar and box (rectangular parallelepiped) shaped. The cooling fin 1 is provided with screw holes HL respectively located at four corners of a flat surface (having the largest dimension) of the box shape. The flat surface (having the largest dimension) of the cooling fin 1 has a minimal dimension that includes parts for mounting the semiconductors 2A and 2B and parts for providing the screw holes HL, as shown in FIG. 5. In other words, the dimension of the flat surface of the cooling fin 1 is slightly larger than a dimension of flat surface of the semiconductors 2A and 2B to provide the screw holes HL.

The cooling fin 1 is a cooling mechanism for cooling the two semiconductor elements 2A and 2B. Furthermore, the cooling fin 1, from a structural point of view, functions as a reinforcing material for increasing strength of the chassis when the power converter 10 is incorporated in the chassis. The cooling fin 1 is a water cooling mechanism. The cooling fin 1 is equipped with a flow inlet 11 and a flow outlet 12 for circulating a cooling medium thereinside.

Each of the semiconductor elements 2A and 2B is joined to the flat surface of the cooling fin 1. The semiconductor elements 2A and 2B are switching elements constituting a power converter circuit. For example, the semiconductor elements 2A and 2B are insulated gate bipolar transistors (IGBTs). On a surface opposite of the surface to which the semiconductor elements 2A and 2B are joined, a direct current conductor or an alternating current conductor which is not shown is provided. To the direct current conductor and the alternating current conductor, terminals, which are for connecting with an external electronic circuit when the power converter 10 is mounted on the chassis, are respectively provided horizontally in a projecting manner in opposite directions with respect to each other.

The flat plate 4 is attached to the cooling fin 1 via the plurality of first support rods 5. The flat plate 4 is a base for attaching the gate substrates 3A and 3B to the power converter 10.

The gate substrates 3A and 3B are substrates which output gate signals for switching the semiconductor elements 2A and 2B in response to requests from outside. The gate substrate 3A outputs a gate signals to the semiconductor element 2A, and the gate substrate 3B outputs a gate signal to the semiconductor element 2B.

Figure 6:
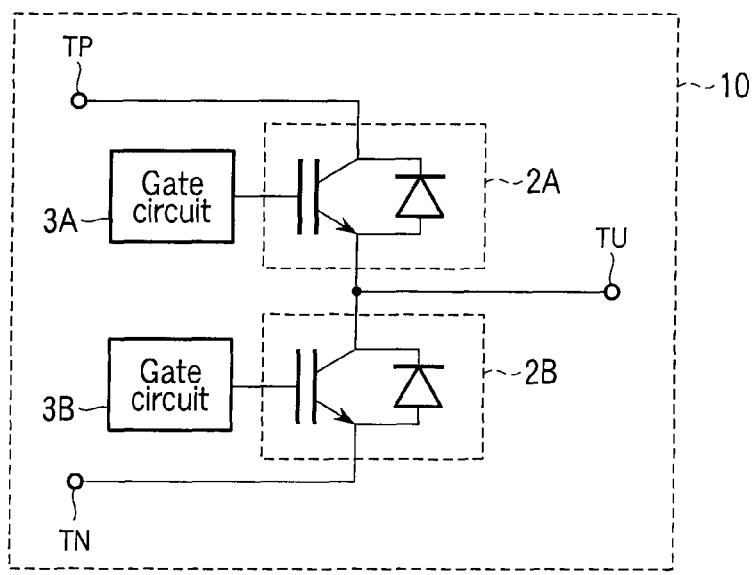
FIG. 6 is an electronic circuit diagram showing a power converter circuit according to the first embodiment.

FIG. 6 is an electronic circuit diagram showing a power converter circuit of the power converter 10 according to the present embodiment.

The power converter circuit of the power converter 10 is connected to an emitter side of the semiconductor element 2A being an IGBT and a collector side of the semiconductor element 2B being an IGBT. A connecting part of the semiconductor elements 2A and 2B is connected to an alternating current conductor. An emitter side of the semiconductor element 2B is connected to a direct current conductor of a negative electrode. A collector side of the semiconductor element 2A is connected to a direct current conductor of a positive electrode.

The alternating current conductor is provided with an alternating current terminal TU for connecting with the outside. The direct current conductor of the positive electrode is provided with a positive electrode TP for connecting with the outside. The direct current conductor of the negative electrode is provided with a negative terminal TN for connecting with the outside.

The power converter circuit of the power converter 10 is a circuit constituting a size of one phase of the power converter circuit which converts DC power into three-phase AC power. DC power is input from the positive terminal TP and the negative terminal TN into the power converter circuit of the power converter 10, and one phase out of the three-phase AC power is output from the alternating current terminal TU.

Figure 8:
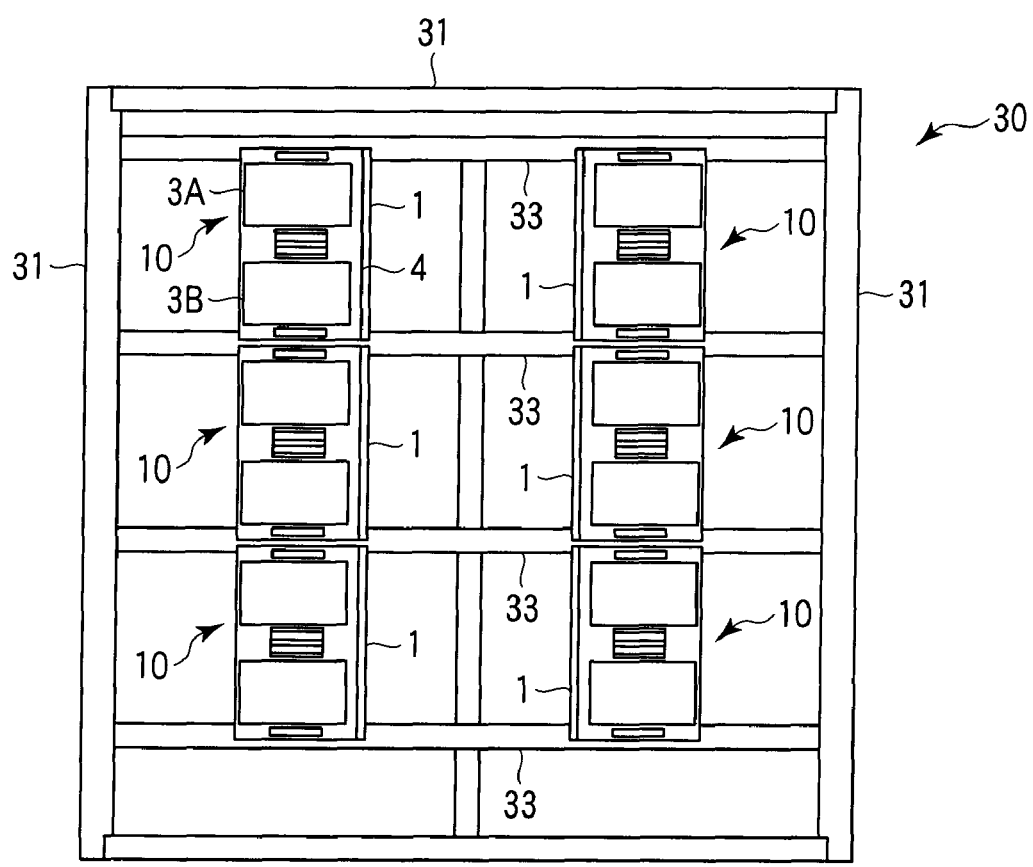
FIG. 8 is a front view showing the configuration of the electrical power apparatus on which the power converter according to the first embodiment is mounted.
Figure 9:
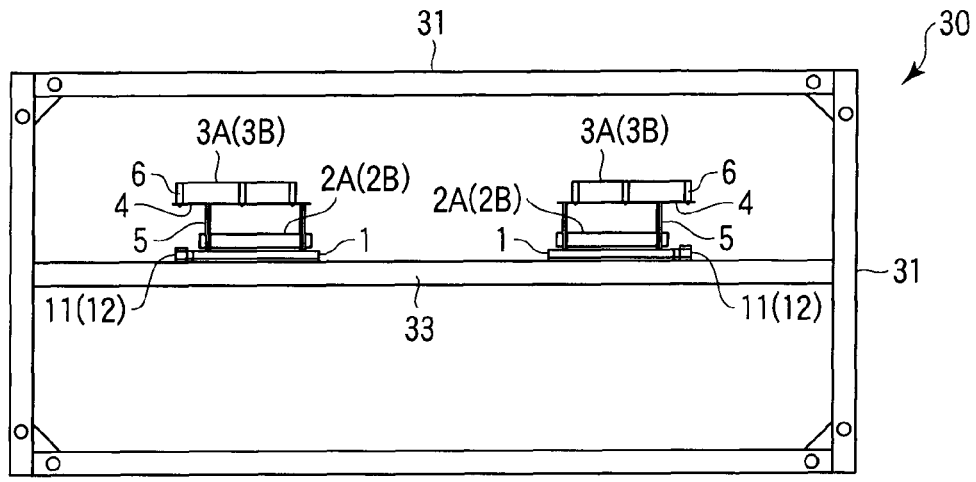
FIG. 9 is a top view showing the configuration of the electrical power apparatus on which the power converter according to the first embodiment is mounted.
Figure 10:
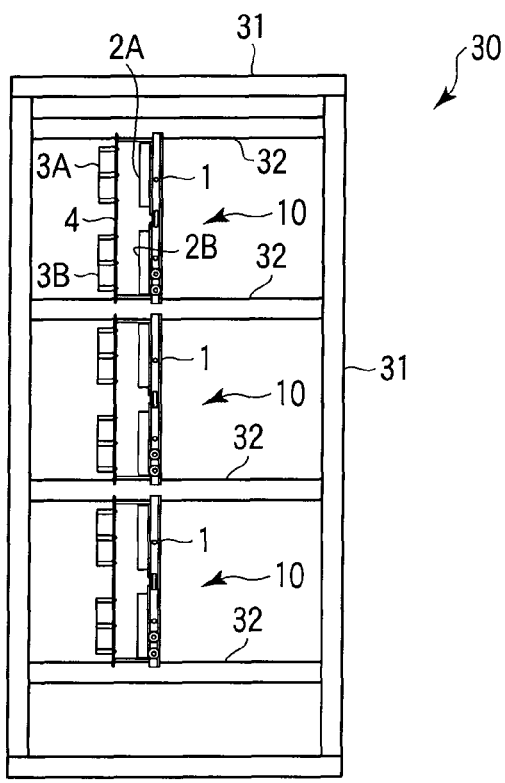
FIG. 10 is a side view showing the configuration of the electrical power apparatus on which the power converter according to the first embodiment is mounted.

FIG. 7 is a perspective view showing a configuration of the electrical power apparatus 30 on which the power converter 10 according to the present embodiment is mounted. FIG. 8 is a front view showing the configuration of the electrical power apparatus 30 on which the power converter 10 according to the present embodiment is mounted. FIG. 9 is a top view showing the configuration of the electrical power apparatus 30 on which the power converter 10 according to the present embodiment is mounted. FIG. 10 is a side view showing the configuration of the electrical power apparatus 30 on which the power converter 10 according to the present embodiment is mounted. In FIGS. 7 to 10, for the sake of convenience, the power converter 10 and component parts of the chassis are mainly shown and other components are omitted.

The electrical power apparatus 30 is configured by mounting the power converter 10 on the chassis. The electrical power apparatus 30 is, for example, a power converter or power supply apparatus.

The chassis is formed with chassis frames such as outer frames 31 and 32, and inner frames 33. The outer frames 31 and 32 form an outer framework of the chassis. The inner frame 33 forms an inner framework of the chassis. The outer shape of the chassis is formed in a box shape with the outer frames 31. The outer frames 32 are set in the outer frames 31 forming a box shape, in such a manner that each of the outer frames 32 connects a pair of outer frames 31 facing horizontally with respect to each surface of the chassis (each side of the box shape). Each of the inner frames 33 connects centers of a pair of the outer frames 32 facing in the horizontal direction.

The inner frames 33 are made of sheet (flat-shaped) steel such as cold-rolled steel, rolled steel for general structure, or treated steel. In other words, the inner frames 33 are made of steel that need not be comparatively strong and that is not subjected to a bending process such as angle bending.

Next, a method of mounting the power converter 10 will be explained.

The electrical power apparatus 30 shown in FIGS. 7 to 10 is provided with six power converters 10 and four inner frames 33.

Each of the power converters 10 is attached between two inner frames 33 adjoining above and below. Each of the power converters 10 is arranged in such a manner that a flat surface of a cooling fin 1 faces the front vertically. Therefore, in each of the power converters 10, all of the screw holes HL respectively provided at the four corners of a cooling fin 1 face the front side. Each of the power converters 10 is fixed to inner frames 33 via the screw holes HL provided in a cooling fin 1.

Six power converters 10 are arranged in such a manner that they are divided into left and right, and at each side, three power converters 10 are aligned vertically. The three aligned power converters 10 are arranged such that adjacent power converters 10 are extremely close to each other on a surface of an inner frame 33. Therefore, the cooling fins 1 of the aligned power converters 10 serve as a chassis frame reinforcing the four inner frames 33 vertically.

According to the present embodiment, by deeming the cooling fin 1 of the power converter 10 as a structural object, it is possible to reduce the number of components of the electrical power apparatus 30 on which the power converters 10 are mounted. As the cooling fins 1 are attached to the power converter 10 as structural object, other cooling components are unnecessary. Thus, members such as a plate for mounting cooling components can be reduced.

Also, in a power converter 10, an area of a flat surface of the cooling fin 1 is made minimal to include a part for mounting the semiconductor elements 2A and 2B and a part for providing the screw holes HL, also on consideration of strength. As a result, an outer shape of the flat surface of the cooling fin 1 is almost equal to an outer shape of a part for mounting the semiconductor elements 2A and 2B. The power converter circuit of the power converter 10 is able to achieve low inductance. The power converter 10 can be made smaller by making the area of the flat surface of the cooling fin 1 minimal. Therefore, the electrical power apparatus 30 can be made smaller by mounting the power converters 10 as electrical power components of the electrical power apparatus 30, and also a power converter circuit as an entire piece of an electrical power apparatus 30 can achieve low inductance.

Furthermore, since the cooling fin 1 also serves as a material for reinforcing the chassis, other reinforcing materials for supporting weight of the power converter 10 need not be provided. Also, since inner frames 33 to which cooling fins 1 are attached are reinforced by the cooling fins 1, the inner frames 33 themselves do not have to be made of strong steel (e.g., equal angle steel or unequal angle steel). Material cost for the electrical power apparatus 30 can therefore be kept down.

Also, as mentioned above, the inner frames 33 to which the power converters 10 are attached do not have to be made of strong steel and can be made of sheeted (tabular) plate. Thus, the cooling fins 1 of respective two power converters 10 can be attached close to each other.

For example, a case in which an inner frame 33 is made of a strong and bending-processed angle material is supposed. If screw holes are opened close to each other in order for attaching two cooling fins close to each other, it is difficult to open the screw holes because a part of the inner frame 33 where bending processed interferes.

It is possible to configure the power converter circuit of the electrical power apparatus 30 to achieve low inductance by having the inner frame 33 made of a sheeted (tabular) plate and each of the power converters 10 provided close to each other. Furthermore, inductance differences between phases can be reduced because inductances between each phase of three-phase AC current output from the power converter circuit are also reduced. Therefore, the power converter circuit is able to output three-phase AC current which is balanced and stable.

When all of the power converters 10 are arranged in such a manner that each of them is attached to an inner frame 33 from the front side of the electrical power apparatus 30, all of the power converters 10 can be maintained from the front (front maintenance). Ease of maintenance of the electrical power apparatus 30 is therefore improved. Also, the electrical power apparatus 30 can be installed at a site where it can be maintained only from the front side.

According to the first embodiment, a power converter 10 is equipped with two semiconductor elements 2A and 2B. However, the number of semiconductor elements may be changed. Also, a semiconductor element is not limited to an IGBT, and may be an element having any function. Further, though the power converter 10 in which the power converter circuit is configured is explained as an electrical power component, an electrical power component is not limited to the power converter 10. Any electrical power component in which any electronic circuit is configured may be employed as long as an electrical power component employs a semiconductor element.

In the first embodiment, components may be added to the configuration of the power converter 10 as needed. As a modification of the first embodiment, the power converter 10 is able to be configured to further include a snubber circuit, even if the power converter 10 comprises an alternating current terminal (AC conductor) TU, positive terminals (DC conductor of positive electrode) TPA and TPB, and negative terminals (DC conductor of negative electrode) TNA and TNB.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling apparatus comprising:
a chassis in which a framework including a frame extending horizontally is formed;
a first semiconductor element; a first water cooling unit having a first planar shape, which cools the first semiconductor element and connects the frame of the chassis and a first part of the chassis located above the frame, and serves as a first reinforcing material for the chassis;
a second semiconductor element; and
a second water cooling unit having a second planar shape, which cools the second semiconductor element and connects the frame of the chassis and a second part of the chassis located below the first water cooling unit, and serves as a second reinforcing material for the chassis.

2. The cooling apparatus according to claim 1, wherein
the first semiconductor element is attached to a surface of the first planar shaped first water cooling unit having a first area, the first area including a first semiconductor element attaching part and a first mounting hole part used for attaching the first water cooling unit to the chassis; and
the second semiconductor element is attached to a surface of the second planar shaped second water cooling unit having a second area, the second area including a second semiconductor element-attaching part and a second mounting hole part used for attaching the second water cooling unit to the chassis.

3. A cooling apparatus comprising:
a chassis in which a framework including four frames extending horizontally is formed, the four frames comprising a first frame, a second frame, a third frame, and a fourth frame being arranged from top to bottom, respectively;
a first semiconductor element;
a first water cooling unit having a first planar shape, which cools the first semiconductor element and connects the first frame and the second frame, and serves as a first reinforcing material for the chassis;
a second semiconductor element;
a second water cooling unit having a second planar shape, which cools the second semiconductor element and connects the second frame and the third frame, and serves as a second reinforcing material for the chassis;
a third semiconductor element; and
a third water cooling unit having a third planar shape, which cools the third semiconductor element and connects the third frame and the fourth frame, and serves as a third reinforcing material for the chassis.

4. The cooling apparatus according to claim 3, wherein
the first semiconductor element is attached to a surface of the first planar shaped first water cooling unit having a first area, the first area including a first semiconductor element-attaching part and a first mounting hole part used for attaching the first water cooling unit to the chassis;
the second semiconductor element is attached to a surface of the second planar shaped second water cooling unit having a second area, the second area including a second semiconductor element-attaching part and a second mounting hole part used for attaching the second water cooling unit to the chassis; and
the third semiconductor element is attached to a surface of the third planar shaped third water cooling unit having a third area, the third area including a third semiconductor element-attaching part and a third mounting hole part used for attaching the third water cooling unit to the chassis.

* * * * *